United States Patent
Ono

(10) Patent No.: US 8,354,873 B2
(45) Date of Patent: Jan. 15, 2013

(54) TRANSMISSION GATE AND SEMICONDUCTOR DEVICE

(75) Inventor: Takashi Ono, Chiba (JP)

(73) Assignee: Seiko Instruments Inc., Chiba (JP)

( * ) Notice: Subject to any disclaimer, the term of this patent is extended or adjusted under 35 U.S.C. 154(b) by 45 days.

(21) Appl. No.: 13/022,338

(22) Filed: Feb. 7, 2011

(65) Prior Publication Data

US 2011/0193615 A1    Aug. 11, 2011

(30) Foreign Application Priority Data

Feb. 9, 2010 (JP) ................. 2010-026931

(51) Int. Cl.
*H03K 17/16* (2006.01)
*H03K 17/687* (2006.01)

(52) U.S. Cl. ......... 327/391; 327/427; 327/437; 327/333

(58) Field of Classification Search ........................ None
See application file for complete search history.

(56) References Cited

U.S. PATENT DOCUMENTS

| | | | | |
|---|---|---|---|---|
| 4,874,971 A | * | 10/1989 | Fletcher | 327/399 |
| 5,194,768 A | * | 3/1993 | Lozano | 327/552 |
| 5,475,332 A | * | 12/1995 | Ishimoto | 327/427 |
| 6,693,479 B1 | * | 2/2004 | Bardsley | 327/390 |
| 8,008,963 B2 | * | 8/2011 | Sonehara et al. | 327/427 |
| 2002/0075060 A1 | * | 6/2002 | Goodell et al. | 327/427 |

FOREIGN PATENT DOCUMENTS

| | | | |
|---|---|---|---|
| JP | 5-95262 | * | 4/1993 |
| JP | 07-169292 A | | 7/1995 |

* cited by examiner

*Primary Examiner* — Tuan T Lam
(74) *Attorney, Agent, or Firm* — Brinks Hofer Gilson & Lione

(57) ABSTRACT

Provided is a transmission gate capable of adapting to various input voltages to attain high S/N characteristics. The transmission gate includes: a PMOS transistor (11) which includes a drain to which an input voltage (Vin) is input, is turned ON when a voltage (Vin−Vs1) is input to a gate thereof, and includes a source from which the input voltage (Vin) is output as an output voltage (Vout); and an NMOS transistor (12) which has a gate length, a gate width, a gate oxide thickness, and an absolute value of a threshold voltage which are the same as those of the PMOS transistor (11), includes a drain to which the input voltage (Vin) is input, is turned ON when a voltage (Vin+Vs1) is input to a gate thereof, and includes a source from which the input voltage (Vin) is output as the output voltage (Vout).

5 Claims, 5 Drawing Sheets

TRANSMISSION GATE AND SEMICONDUCTOR DEVICE

RELATED APPLICATIONS

This application claims priority under 35 U.S.C. §119 to Japanese Patent Application No. 2010-026931 filed on Feb. 9, 2010, the entire content of which is hereby incorporated by reference.

BACKGROUND OF THE INVENTION

1. Field of the Invention

The present invention relates to a transmission gate and a semiconductor device.

2. Description of the Related Art

A conventional transmission gate is described. FIG. 8 is a circuit diagram illustrating the conventional transmission gate.

The transmission gate includes a PMOS transistor 91 and an NMOS transistor 92. In those transistors, gates thereof are controlled by complementary signals, and thus the transistors are turned ON/OFF simultaneously. When a low level voltage is input to the gate of the PMOS transistor 91, and a high level voltage is input to the gate of the NMOS transistor 92, electrical continuity of the transmission gate is established. Then, the transmission gate outputs an input voltage Vin as an output voltage Vout.

Here, a gate-to-source capacitance of the PMOS transistor 91 is represented by Cgsp, a gate-to-source capacitance of the NMOS transistor 92 is represented by Cgsn, a parasitic capacitance at an output terminal is represented by Ch, a threshold voltage of the PMOS transistor 91 is represented by −Vtp, and a threshold voltage of the NMOS transistor 92 is represented by Vtn. Further, a voltage magnitude applied to the gate of the PMOS transistor 91 is represented by V5, and a voltage magnitude applied to the gate of the NMOS transistor 92 is represented by V4. When the transmission gate is set so as to satisfy the following Expression (11), influence of clock feedthrough is reduced. Therefore, it is possible to attain high S/N characteristics (for example, see JP 07-169292 A).

$$(V5-Vout-Vtp)\cdot Cgsp/(Cgsp+Ch) = (V4-Vout-Vtn)\cdot Cgsn/(Cgsn+Ch) \quad (11)$$

However, in the related art, Expression (11) is satisfied based on the presupposition that the input voltage Vin is a constant voltage (for example, (VDD+VSS)/2) and does not fluctuate. In other words, when the input voltage Vin fluctuates and therefore the output voltage Vout fluctuates, Expression (11) is not satisfied. Therefore, the S/N characteristics are degraded due to the influence of clock feedthrough.

SUMMARY OF THE INVENTION

The present invention has been made in view of the above-mentioned problem, and an object of the present invention is therefore to provide a trans-mission gate capable of adapting to various input voltages to attain high S/N characteristics.

In order to solve the above-mentioned problem, according to the present invention, there is provided a transmission gate including: a PMOS transistor which includes a drain to which an input voltage is input, is turned ON when a first voltage obtained by subtracting a predetermined voltage from the input voltage is input to a gate of the PMOS transistor, and includes a source from which the input voltage is output as an output voltage; and an NMOS transistor which has a gate length, a gate width, a gate oxide thickness, and an absolute value of a threshold voltage which are the same as a gate length, a gate width, a gate oxide thickness, and an absolute value of a threshold voltage of the PMOS transistor, respectively, includes a drain to which the input voltage is input, is turned ON when a second voltage obtained by adding the predetermined voltage to the input voltage is input to a gate of the NMOS transistor, and includes a source from which the input voltage is output as the output voltage.

In the transmission gate according to the present invention, MOS transistors constituting the transmission gate have gate voltages controlled by voltages based on the input voltage, and hence it is possible to reduce influence of clock feedthrough, and adapt to various input voltages to attain high S/N characteristics.

DETAILED DESCRIPTION OF THE PREFERRED EMBODIMENT

Hereinafter, an embodiment of the present invention is described with reference to the accompanying drawings.

Figure 1:
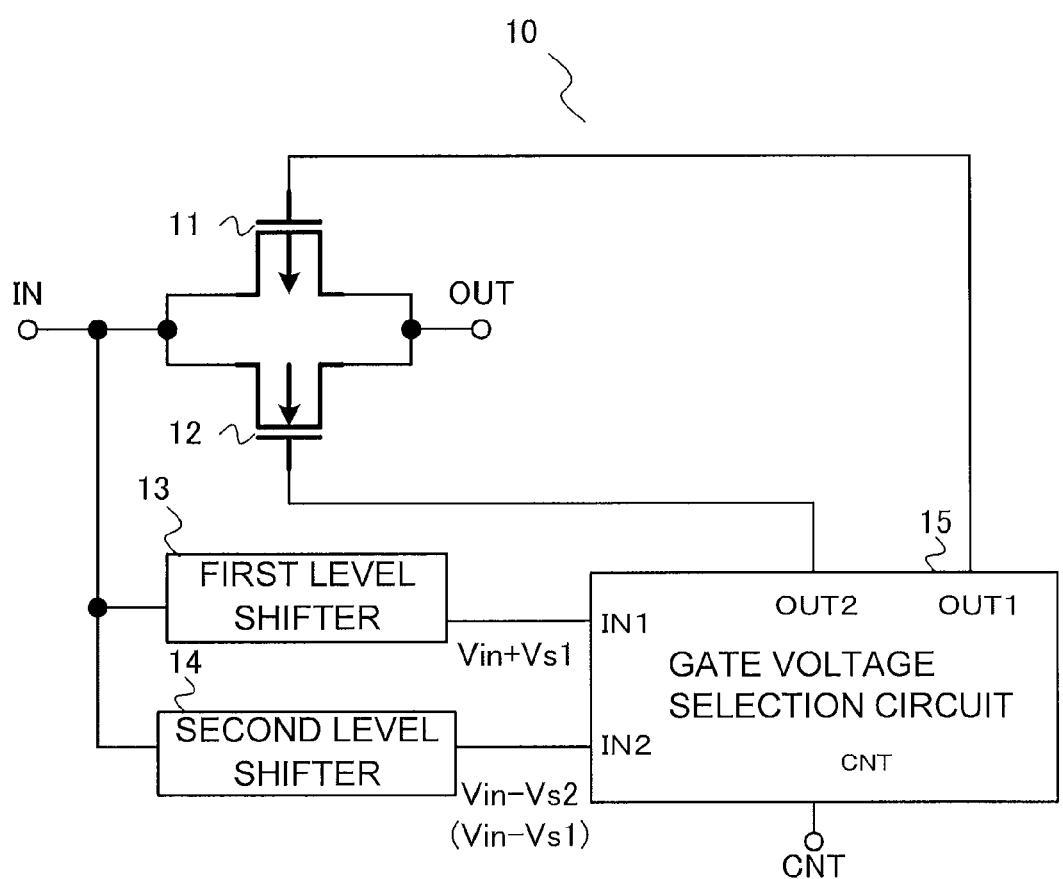
FIG. 1 is a circuit diagram illustrating a transmission gate according to an embodiment of the present invention.

First, a configuration of a transmission gate is described. FIG. 1 is a circuit diagram illustrating the transmission gate according to this embodiment.

A transmission gate 10 includes a PMOS transistor 11, an NMOS transistor 12, a first level shifter 13, a second level shifter 14, and a gate voltage selection circuit 15. Further, the transmission gate 10 includes an input terminal IN, an output terminal OUT, and a control terminal CNT.

The gate voltage selection circuit 15 includes an input terminal IN1 connected to an output terminal of the first level shifter 13, a second input terminal IN2 connected to an output terminal of the second level shifter 14, a control terminal CNT connected to the control terminal CNT of the transmission gate 10, a first output terminal OUT1 connected to a gate of the PMOS transistor 11, and a second output terminal OUT2 connected to a gate of the NMOS transistor 12. Sources of the PMOS transistor 11 and the NMOS transistor 12 are respectively connected to the output terminal OUT of the transmission gate 10, and drains of the PMOS transistor 11 and the NMOS transistor 12 are respectively connected to the input terminal IN of the transmission gate 10. Input terminals of the first level shifter 13 and the second level shifter 14 are respectively connected to the input terminal IN of the transmission gate 10.

Figure 2:
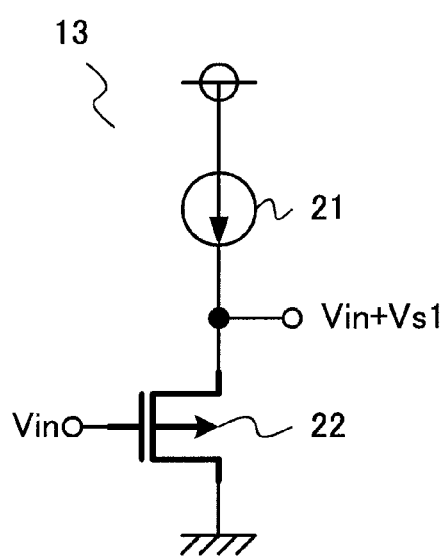
FIG. 2 is a circuit diagram illustrating a first level shifter.

Next, a configuration of the first level shifter 13 is described. FIG. 2 is a circuit diagram illustrating the first level shifter.

The first level shifter 13 includes a current source 21 and a PMOS transistor 22. The PMOS transistor 22 includes a gate connected to the input terminal of the first level shifter 13, a source connected to the output terminal of the first level shifter 13, and a drain connected to a ground terminal. The current source 21 is provided between a power supply terminal and the output terminal of the first level shifter 13.

Figure 3:
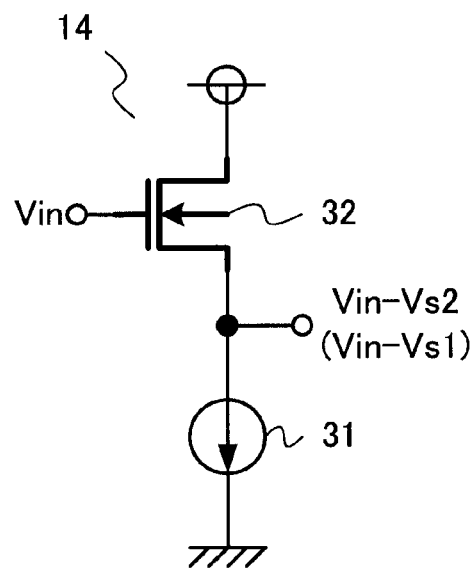
FIG. 3 is a circuit diagram illustrating a second level shifter.

Next, a configuration of the second level shifter 14 is described. FIG. 3 is a circuit diagram illustrating the second level shifter.

The second level shifter 14 includes a current source 31 and an NMOS transistor 32. The NMOS transistor 32 includes a gate connected to the input terminal of the second level shifter 14, a source connected to the output terminal of the second level shifter 14, and a drain connected to the power supply terminal. The current source 31 is provided between the output terminal of the second level shifter 14 and the ground terminal.

Figure 4:
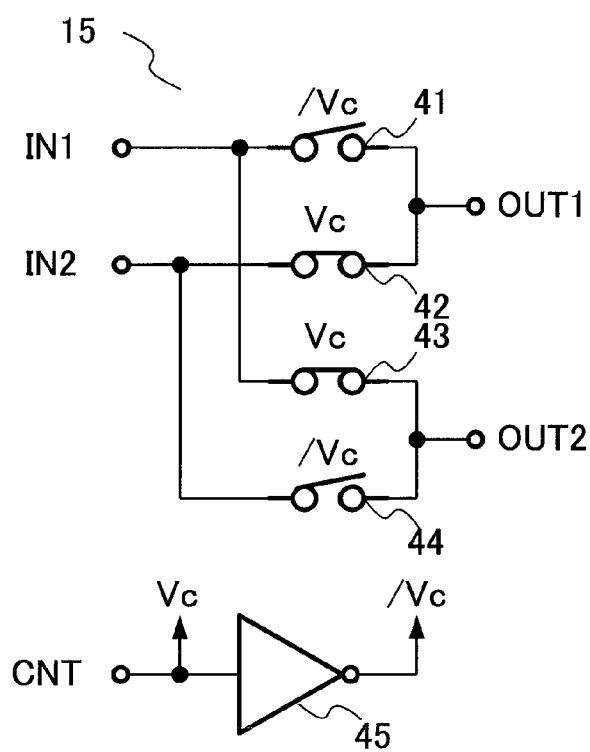
FIG. 4 is a circuit diagram illustrating a gate voltage selection circuit.

Next, a configuration of the gate voltage selection circuit 15 is described. FIG. 4 is a circuit diagram illustrating the gate voltage selection circuit.

The gate voltage selection circuit 15 includes switches 41 to 44 and an inverter 45. Further, the gate voltage selection circuit 15 includes the first input terminal IN1, the second input terminal IN2, the control terminal CNT, the first output terminal OUT1, and the second output terminal OUT2.

Figure 6:
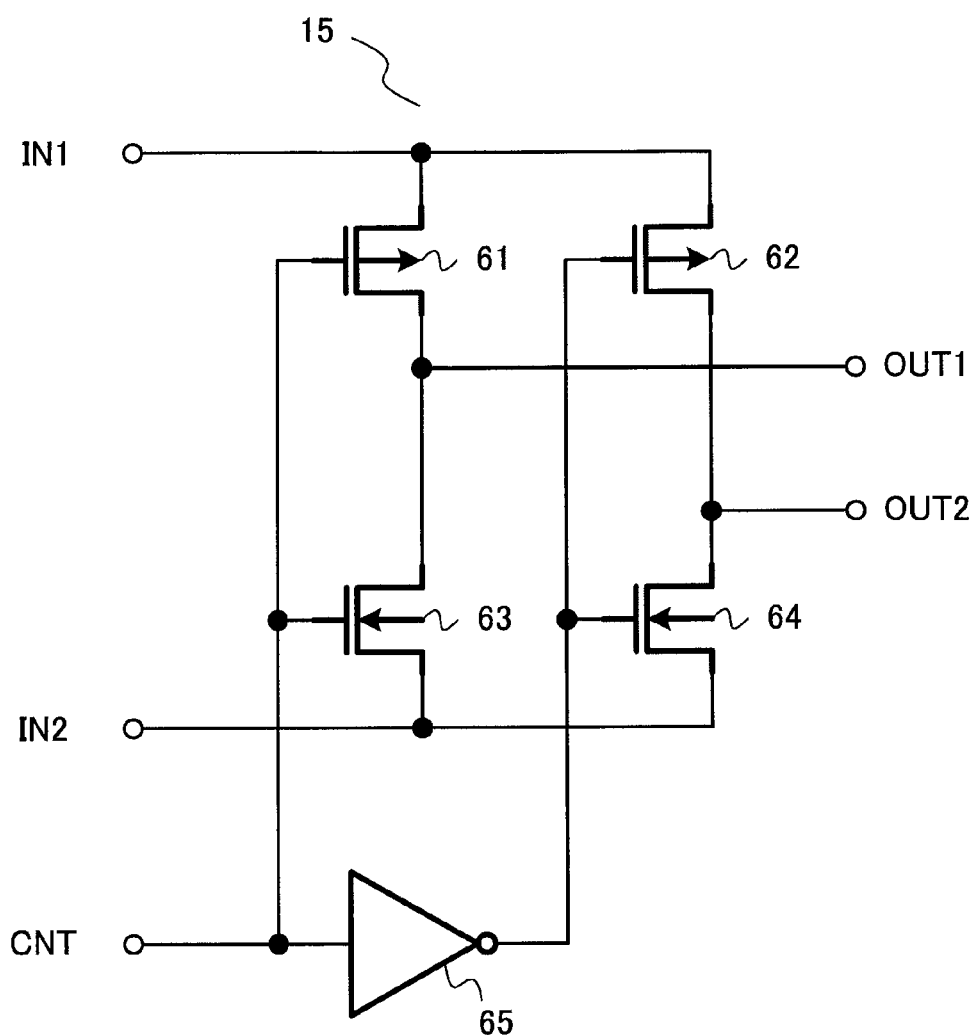
FIG. 6 is a circuit diagram illustrating the gate voltage selection circuit.

The switch 41 is provided between the first input terminal IN1 and the first output terminal OUT1 of the gate voltage selection circuit 15, and is controlled by a voltage /Vc. The switch 42 is provided between the second input terminal IN2 and the first output terminal OUT1 of the gate voltage selection circuit 15, and is controlled by a voltage Vc. The switch 43 is provided between the first input terminal IN1 and the second output terminal OUT2 of the gate voltage selection circuit 15, and is controlled by the voltage Vc. The switch 44 is provided between the second input terminal IN2 and the second output terminal OUT2 of the gate voltage selection circuit 15, and is controlled by the voltage /Vc. An input terminal of the inverter 45 is connected to the control terminal CNT of the gate voltage selection circuit 15. The inverter 45 receives the voltage Vc, and outputs the voltage /Vc. The switches 41 to 44 are constituted by, for example, MOS transistors 61 to 64 as illustrated in FIG. 6.

Next, an operation of the transmission gate 10 is described.

An input voltage Vin of the input terminal IN is input to the input terminal of the first level shifter 13 and the input terminal of the second level shifter 14.

The first level shifter 13 is a source follower, and hence a source voltage of the PMOS transistor 22 becomes a voltage (Vin+Vs1). The voltage Vs1 is a total voltage of an absolute value of a threshold voltage (−Vtp) of the PMOS transistor 22 and an overdrive voltage Vo1. The first level shifter 13 outputs the voltage (Vin+Vs1) from the output terminal thereof.

The second level shifter 14 is a source follower, and hence a source voltage of the NMOS transistor 32 becomes a voltage (Vin−Vs2). The voltage Vs2 is a total voltage of a threshold voltage Vtn of the NMOS transistor 32 and an overdrive voltage Vo2. The second level shifter 14 outputs the voltage (Vin−Vs2) from the output terminal thereof.

The first level shifter 13 and the second level shifter 14 are designed to satisfy Expressions (1) to (3).

$$Vtp=Vtn \quad (1)$$

$$Vo1=Vo2 \quad (2)$$

$$Vs1=Vtp+Vo1=Vs2=Vtn+Vo2 \quad (3)$$

Here, when the voltage Vc input to the control terminal CNT is a high level voltage, the voltage /Vc is a low level voltage. Then, the switch 42 and the switch 43 are turned ON, and the switch 41 and the switch 44 are turned OFF. Therefore, the gate voltage selection circuit 15 outputs the voltage (Vin−Vs2) of the second input terminal IN2, that is, the voltage (Vin−Vs1) from the first output terminal OUT1. Further, the gate voltage selection circuit 15 outputs the voltage (Vin+Vs1) of the first input terminal IN1 from the second output terminal OUT2.

Therefore, a gate voltage of the PMOS transistor 11 becomes the voltage (Vin−Vs1), and a gate-to-source voltage Vgsp of the PMOS transistor 11 is expressed by the following Expression (4).

$$Vgsp=-Vs1=-(Vtp+Vo1) \quad (4)$$

The gate-to-source voltage Vgsp of the PMOS transistor 11 becomes lower than the threshold voltage (−Vtp) thereof, and hence the PMOS transistor 11 is turned ON.

Further, a gate voltage of the NMOS transistor 12 becomes the voltage (Vin+Vs1), and a gate-to-source voltage Vgsn of the NMOS transistor 12 is expressed by the following Expression (5).

$$Vgsn=Vs2=Vtn+Vo2=Vs1=Vtp+Vo1 \quad (5)$$

The gate-to-source voltage Vgsn of the NMOS transistor 12 becomes higher than the threshold voltage Vtn thereof, and hence the NMOS transistor 12 is turned ON.

Therefore, electrical continuity of the transmission gate 10 is established, and the input voltage Vin is output to the output terminal OUT as an output voltage Vout.

Next, when the voltage Vc input to the control terminal CNT is a low level voltage, the voltage /Vc is a high level voltage. Then, the switch 42 and the switch 43 are turned OFF, and the switch 41 and the switch 44 are turned ON. Therefore, the gate voltage selection circuit 15 outputs the voltage (Vin+Vs1) of the first input terminal IN1 from the first output terminal OUT1. Further, the gate voltage selection circuit 15 outputs the voltage (Vin−Vs2) of the second input terminal IN2, that is, the voltage (Vin−Vs1) from the second output terminal OUT2.

Therefore, the gate voltage of the PMOS transistor 11 becomes the voltage (Vin+Vs1), and the gate-to-source voltage Vgsp of the PMOS transistor 11 is expressed by the following Expression (6).

$$Vgsp=Vs1=Vtp+Vo1 \quad (6)$$

The gate-to-source voltage Vgsp of the PMOS transistor 11 becomes higher than the threshold voltage (−Vtp) thereof, and hence the PMOS transistor 11 is turned OFF.

Further, the gate voltage of the NMOS transistor 12 becomes the voltage (Vin−Vs1), and the gate-to-source voltage Vgsn of the NMOS transistor 12 is expressed by the following Expression (7).

$$Vgsn=-Vs2=-(Vtn+Vo2)=-Vs1=-(Vtp+Vo1) \quad (7)$$

The gate-to-source voltage Vgsn of the NMOS transistor 12 becomes lower than the threshold voltage Vtn thereof, and hence the NMOS transistor 12 is turned OFF.

Therefore, electrical continuity of the transmission gate 10 is broken, and the input voltage Vin is not output to the output terminal OUT as the output voltage Vout.

Here, in the transmission gate 10, the gate length, the gate width, and the gate oxide thickness of the PMOS transistor 11 are set equal to the gate length, the gate width, and the gate oxide thickness of the NMOS transistor 12, respectively. Then, a gate-to-source capacitance Cgsp of the PMOS transistor 11 and a gate-to-source capacitance Cgsn of the NMOS transistor 12 become equal to each other. Further, from Expression (1), the threshold voltage Vtp of the PMOS transistor 11 and the threshold voltage Vtn of the NMOS transistor 12 are equal to each other. Further, when the voltage Vc is a high level voltage, from Expressions (4) and (5), the absolute value of the gate-to-source voltage Vgsp of the PMOS transistor 11 and the gate-to-source voltage Vgsn of the NMOS transistor 12 are equal to each other.

In the transmission gate 10 configured as described above, Expression (8), which is based on Expression (11) described in the related art, is satisfied, and hence the influence of clock feedthrough is reduced, and high S/N characteristics are attained.

$$(|Vgsp|-|Vtp|) \cdot Cgsp/(Cgsp+Ch)=(Vgsn-Vtn) \cdot Cgsn/(Cgsn+Ch) \quad (8)$$

Cgsp represents the gate-to-source capacitance of the PMOS transistor 11, Cgsn represents the gate-to-source capacitance of the NMOS transistor 12, and Ch represents a parasitic capacitance at the output terminal.

Further, with reference to Expression (2), Expressions (4) and (5), and Expression (8), the following Expression (9) is satisfied.

$$Cgsp/(Cgsp+Ch)=Cgsn/(Cgsn+Ch) \quad (9)$$

This Expression (9) does not depend on the input voltage Vin. That is, in the transmission gate 10, the influence of clock feedthrough is reduced and the high S/N characteristics are attained irrespective of the voltage value of the input voltage Vin.

When configured as described above, the MOS transistors constituting the transmission gate 10 have gate voltages which are based on the input voltage Vin, and hence even when the input voltage Vin fluctuates, the influence of clock feedthrough may be reduced and the high S/N characteristics may be attained.

Figure 5:
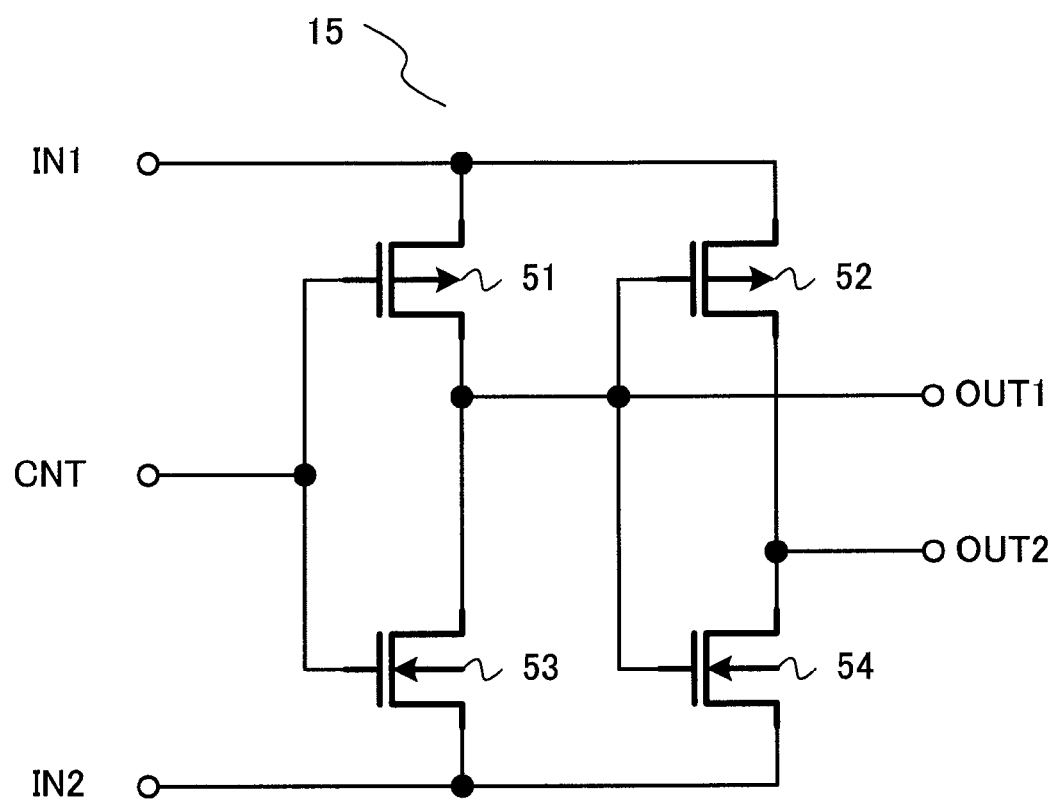
FIG. 5 is a circuit diagram illustrating another gate voltage selection circuit.

Note that, the gate voltage selection circuit 15 is not limited to the circuit illustrated in FIG. 4, and for example, may be a circuit configured as illustrated in FIG. 5.

The gate voltage selection circuit illustrated in FIG. 5 includes PMOS transistors 51 and 52 and NMOS transistors 53 and 54. Further, the gate voltage selection circuit includes the first input terminal IN1, the second input terminal IN2, the control terminal CNT, the first output terminal OUT1, and the second output terminal OUT2.

The PMOS transistor 51 and the NMOS transistor 53 constitute a first inverter having the voltage (Vin+Vs1) as a power supply voltage and the voltage (Vin−Vs2) as a ground voltage. The PMOS transistor 52 and the NMOS transistor 54 constitute a second inverter having the voltage (Vin+Vs1) as the power supply voltage and the voltage (Vin−Vs2) as the ground voltage. The second inverter is provided in the later stage of the first inverter. The first inverter includes an input terminal connected to the control terminal CNT of the gate voltage selection circuit 15, and an output terminal connected to the first output terminal OUT1 of the gate voltage selection circuit 15. The second inverter includes an input terminal connected to the first output terminal OUT1 of the gate voltage selection circuit 15, and an output terminal connected to the second output terminal OUT2 of the gate voltage selection circuit 15.

In addition, although not illustrated, the current source 21 and the current source 31, which are used in the first level shifter 13 and the second level shifter 14, respectively, may be replaced by resistors.

Figure 7:
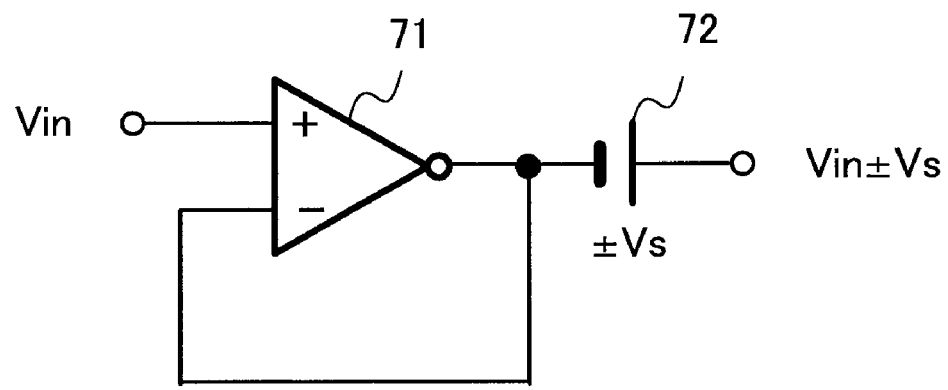
FIG. 7 is a circuit diagram illustrating another example of the level shifter.
Figure 8:
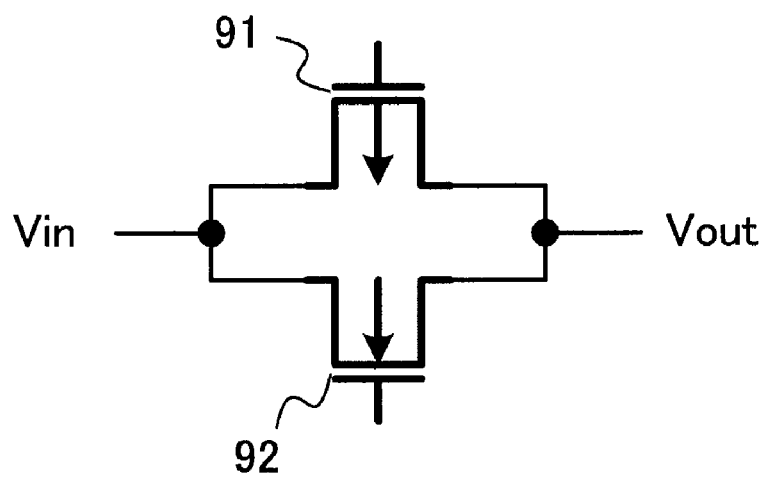
FIG. 8 is a circuit diagram illustrating a conventional transmission gate.

Further, the first level shifter 13 and the second level shifter 14 are exemplified as circuits illustrated in FIG. 2 and FIG. 3, respectively. However, the first level shifter 13 and the second level shifter 14 may be any circuits which receive the input voltage Vin and output the output voltage Vin±Vs1. For example, the first level shifter 13 and the second level shifter 14 may be constituted by a buffer amplifier as illustrated in FIG. 7.

What is claimed is:

1. A transmission gate, comprising:
   a PMOS transistor including a gate and a drain that receives an input voltage, and a source that outputs the input voltage;
   an NMOS transistor including a gate and a drain that receives the input voltage, and a source that outputs the input voltage;
   wherein a gate length, a gate width, a gate oxide thickness, and an absolute value of a threshold voltage are the same for both the PMOS transistor and the NMOS transistor;
   a first level shifter for generating a first voltage from the input voltage; and
   a second level shifter for generating a second voltage from the input voltage,
   wherein the PMOS transistor is turned ON when the first voltage, obtained by subtracting a first predetermined voltage from the input voltage, is input to the gate of the PMOS transistor and the NMOS transistor is turned ON when a second voltage, obtained by adding a second predetermined voltage to the input voltage, is input to the gate of the NMOS transistor,
   wherein the first predetermined voltage is the sum of a first level shifter PMOS transistor threshold voltage and an overdrive voltage, and the second predetermined voltage is the sum of a second level shifter NMOS transistor threshold voltage and the overdrive voltage.

2. A transmission gate according to claim 1, further comprising:
   a gate voltage selection circuit for inputting one of the first voltage and the second voltage to the gate of the PMOS transistor, and inputting another of the first voltage and the second voltage to the gate of the NMOS transistor.

3. A semiconductor device, comprising the transmission gate according to claim 1.

4. A semiconductor device, comprising the transmission gate according to claim 2.

5. A transmission gate, comprising:
   a PMOS transistor including a gate and a drain that receives an input voltage, and a source that outputs the input voltage;
   an NMOS transistor including a gate and a drain that receives the input voltage, and a source that outputs the input voltage;
   wherein a gate length, a gate width, a gate oxide thickness, and an absolute value of a threshold voltage are the same for both the PMOS transistor and the NMOS transistor, and
   wherein the PMOS transistor is turned ON when a first voltage obtained by subtracting a predetermined voltage from the input voltage is input to a gate of the PMOS transistor and the NMOS transistor is turned ON when a second voltage obtained by adding the predetermined voltage to the input voltage is input to a gate of the NMOS transistor; and
   a gate voltage selection circuit having a control terminal, wherein the first and second voltage is output by the gate voltage selection circuit when a high control voltage is input to the control terminal, and the first and second voltage is not output when a low control voltage, less than the high control voltage, is input to the control terminal.

* * * * *